(12) United States Patent
Chueh et al.

(10) Patent No.: US 9,305,754 B2
(45) Date of Patent: Apr. 5, 2016

(54) MAGNET MODULE HAVING EPICYCLIC GEARING SYSTEM AND METHOD OF USE

(75) Inventors: Chia-Liang Chueh, Chiayi (TW); Hsu-Shui Liu, Pingjhen (TW); Jiun-Rong Pai, Jhubei (TW); Pei-Nung Chen, Hsinchu (TW); Yeh-Chieh Wang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 203 days.

(21) Appl. No.: 13/543,638

(22) Filed: Jul. 6, 2012

(65) Prior Publication Data

US 2014/0008213 A1 Jan. 9, 2014

(51) Int. Cl.
| | |
|---|---|
| *C23C 14/00* | (2006.01) |
| *C25B 11/00* | (2006.01) |
| *C25B 13/00* | (2006.01) |
| *H01J 37/34* | (2006.01) |
| *C23C 14/35* | (2006.01) |

(52) U.S. Cl.
CPC ............ *H01J 37/3455* (2013.01); *C23C 14/351* (2013.01); *H01J 37/3405* (2013.01); *H01J 37/3408* (2013.01)

(58) Field of Classification Search
CPC .............. H01J 37/3408; H01J 37/3455; H01J 37/3405; C23C 14/35
USPC ......................................... 204/298.2, 298.16
See application file for complete search history.

(56) References Cited

U.S. PATENT DOCUMENTS

| | | | | |
|---|---|---|---|---|
| 6,132,565 | A | 10/2000 | Lin | |
| 6,206,800 | B1 * | 3/2001 | Kay | ............................... 475/346 |
| 2003/0217914 | A1 * | 11/2003 | Miller et al. | ............. 204/192.12 |
| 2005/0274610 | A1 * | 12/2005 | Iseki | .......................... 204/298.2 |

* cited by examiner

*Primary Examiner* — Ibrahime A Abraham
(74) *Attorney, Agent, or Firm* — Hauptman Ham, LLP (57) ABSTRACT

This disclosure relates to a magnet assembly including an epicyclic gearing system. The epicyclic gearing system including a central gear configured to be rotated, at least one peripheral gear connected to the central gear and configured to rotate and translate relative to the central gear, and an annulus surrounding the at least one peripheral gear and connected with the at least one peripheral gear. The magnet assembly further includes a magnet module connected with the epicyclic gearing system, the magnet module including a support connected with the at least one peripheral gear, the axis of rotation of the support being coaxial with the axis of rotation of the at least one peripheral gear connected with the support.

20 Claims, 8 Drawing Sheets

MAGNET MODULE HAVING EPICYCLIC GEARING SYSTEM AND METHOD OF USE

BACKGROUND

Fabrication of semiconductor devices includes interconnect structures to provide electrical connection between active components in the semiconductor devices. The interconnect structure is formed by creating openings for vias and lines in a dielectric material. Metal layers are then deposited in the openings to form a conductive path to provide electrical connection between the active components.

Physical vapor deposition (PVD) or sputtering is an effective means of depositing metal layers to interconnect structures. Sputtering is performed by introducing a gas into a sputtering chamber and igniting the gas to form a plasma. The plasma is then directed at a target comprising a metal material to be deposited on a wafer or substrate. The plasma physically removes atoms or atomic groups from the target. The atoms are attracted to a wafer or substrate by a bias applied to a support on which the wafer is positioned. The atoms contact the wafer and form metal layers on exposed surfaces of the wafer.

A magnet module located at a side of the target away from the wafer is used to disperse the plasma over a surface of the target. The magnet module includes several magnets which form magnetic fields which attract the plasma increasing the density of the plasma near the surface of the target. A rate of sputtering is directly related to the plasma density. In conventional techniques, the magnet module is rotated about an axis which is centered in the chamber. The rotation of the magnet module changes the location of the magnetic fields and therefore the location of the higher plasma density.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
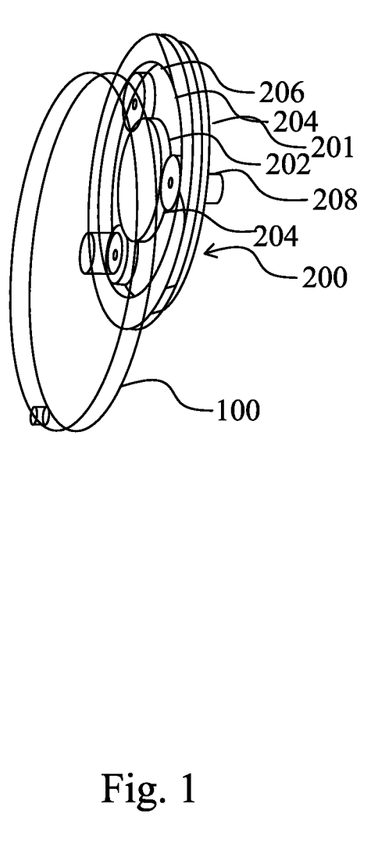
FIG. 1 is a perspective view of a magnet module attached to an epicyclic gearing system in accordance with one or more embodiments.

FIG. 1 is a perspective view of a magnet module 100 attached to an epicyclic gearing system 200. Magnet module 100 includes an arrangement of magnets attached to a surface facing away from epicyclic gearing system 200. Epicyclic gearing systems are also referred to as planetary gearing systems. Epicyclic gearing system 200 includes a support structure 201 configured to receive gears of the epicyclic gearing system. A central gear 202, also referred to as a sun gear, is rotatably attached to support structure 201, so that an axis of rotation of the central gear is centered on the support structure. Peripheral gears 204, also referred to as a planet gears, are connected to, i.e., meshed with, central gear 202 and movably attached to support structure 201. Magnet module 100 is configured to fixably or rotatably attach to peripheral gear 204. An annulus 206 surrounds peripheral gear 204 and central gear 202. Annulus 206 is centered around central gear 202 and has an inner diameter equal to the diameter of the central gear plus the diameter of two peripheral gears. Annulus 206 is held stationary by support structure 201. A shaft 208 passes through support structure 201 and is connected to central gear 202. In operation, rotation of shaft 208 causes rotation of central gear 202.

Figure 7:
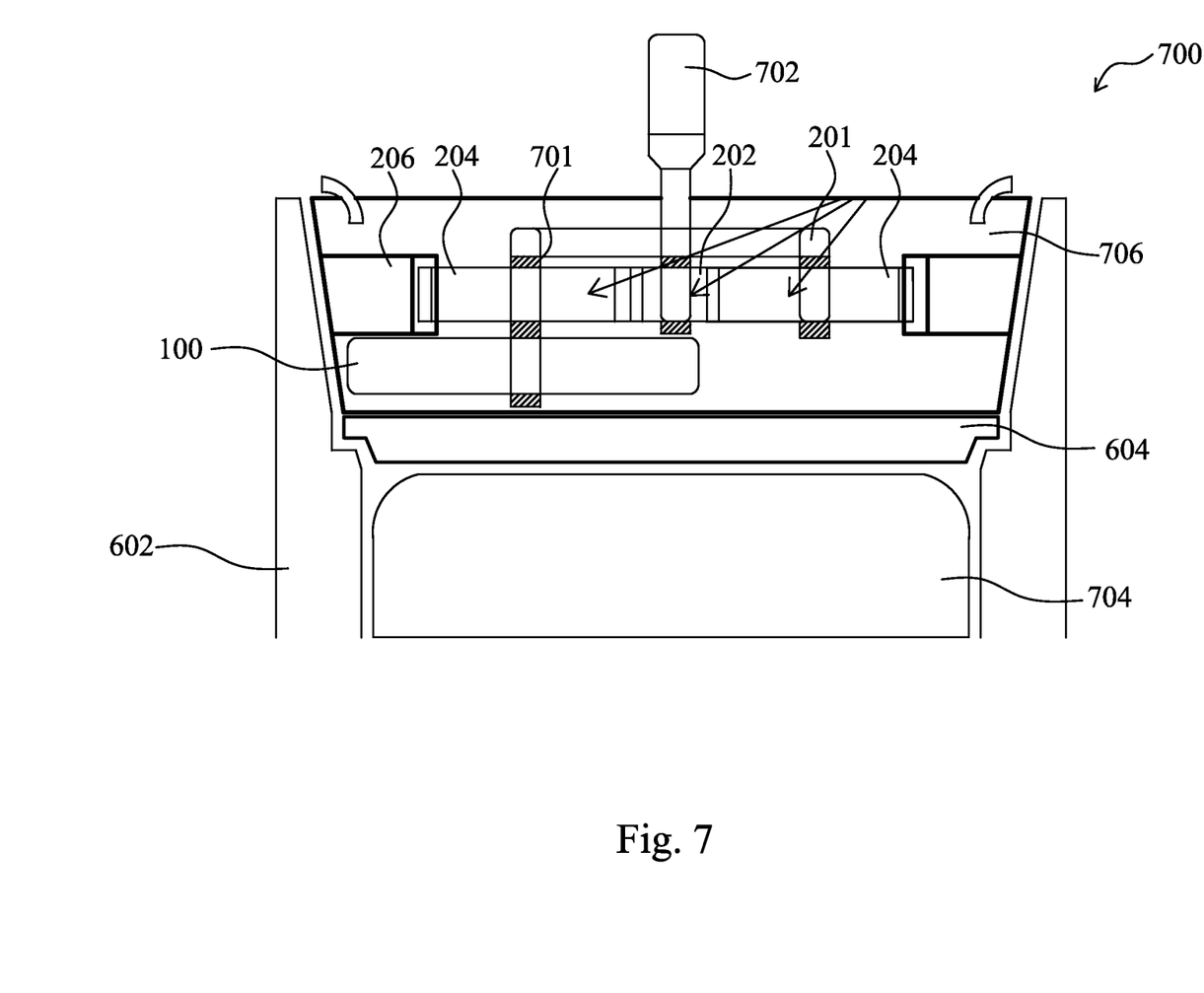
FIG. 7 is a cross-sectional view of a top portion of a sputtering chamber in accordance with one or more embodiments.

Peripheral gear 204 is attached to support structure 201 by a peripheral shaft 701 (FIG. 7). Peripheral shaft 701 allows peripheral gear 204 to rotate and translate relative to central gear 202. In some embodiments, peripheral gear 204 is fixed to support structure 201 such that the support structure rotates at a rate equal to a rate of translation of the peripheral gear, i.e., support structure 201 is fixed to peripheral gear 204. In some embodiments, support structure 201 is stationary and the peripheral shaft translates relative to the support structure, e.g., through a shaft, a track or an equivalent structure. In some embodiments, peripheral gear 204 is attached to support structure 201 by means other than peripheral shaft 701, such as a screw, a socket or other suitable attachment arrangements.

Teeth of peripheral gear 204 are configured to interlock or mesh with teeth of central gear 202, such that rotation of the central gear results in rotation of the peripheral gear. A direction of rotation for central gear 202 will be opposite to a direction of rotation of peripheral gear 204, i.e., if the central gear rotates in a clockwise direction, the peripheral gear will rotate in a counter-clockwise direction. A rate of rotation of peripheral gear 204 relative to central gear 202 is adjustable by altering a number of teeth of the peripheral gear. The relative rate of rotation of peripheral gear 204 is determined by a ratio of a number of teeth of central gear 202 to the number of teeth of the peripheral gear. The relative rate of rotation of peripheral gear 204 is inversely proportional to the number of teeth of the peripheral gear. In addition to rotation about a rotation axis, peripheral gear 204 will two-dimensionally translate in a circular path around central gear 202 between annulus 206 and the central gear.

As a result of the movement of peripheral gear 204, magnet module 100 will rotate around the rotation axis of the peripheral gear and translate in the path around the central gear 202 along with the peripheral gear. The movement of magnet module 100 changes a location of a magnetic field generated by the magnets attached to the magnet module.

The teeth of peripheral gear 204 are also configured to interlock or mesh with teeth of annulus 206. Interlocking of the teeth of peripheral gear 204 and annulus 206 helps to minimize slipping of the peripheral gear during rotation and translation.

The above description of epicyclic gearing system 200 includes a rotating central gear 202. In some embodiments, central gear 202 is held stationary on support structure 201 and annulus 206 is rotated in order to rotate peripheral gear 204. In embodiments having a rotating annulus, a rate of rotation of peripheral gear 204 relative to annulus 206 is defined by a ratio of the number of teeth of the peripheral gear to a number of teeth of the annulus. The relative rate of rotation of peripheral gear 204 is directly proportional to the number of teeth of the peripheral gear.

The above description of epicyclic gearing system 200 is directed to a simple gear system, i.e., one peripheral gear 204 between central gear 202 and annulus 206. In some embodiments, epicyclic gearing system 200 includes meshed peripheral gears in which more than one peripheral gear is positioned between central gear 202 and annulus 204 along a straight line extending radially outward from the central gear. In some embodiments, epicyclic gearing system includes stepped peripheral gears in which one peripheral gear is positioned atop another peripheral gear such that both peripheral gears have a common axis of rotation. In some embodiments, epicyclic gearing system 200 includes a multi-stage structure in which more than one set of concentric peripheral gears are positioned between central gear 202 and annulus 206.

Figure 2:
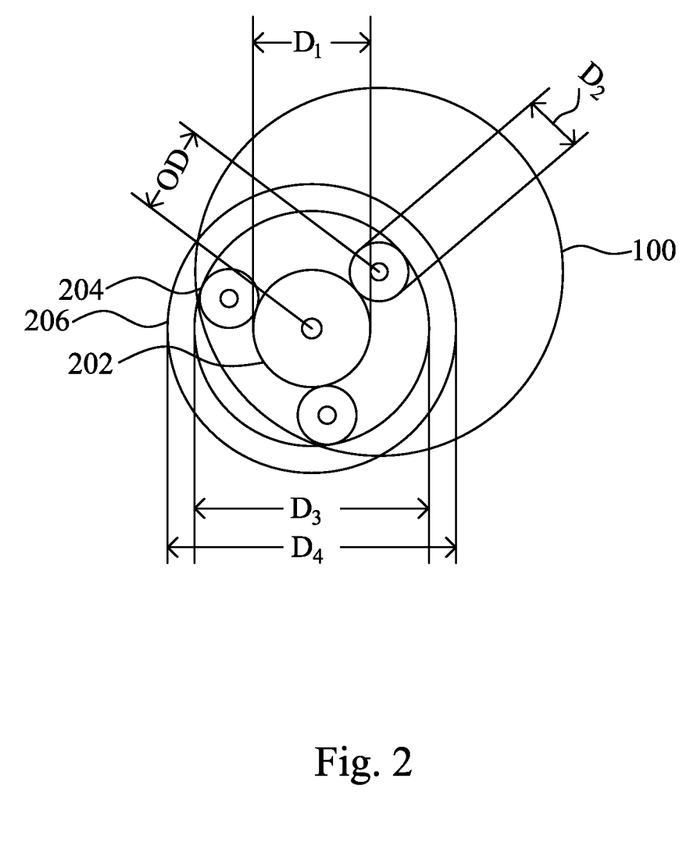
FIG. 2 is a bottom view of a magnet module attached to an epicyclic gearing system in accordance with one or more embodiments.

FIG. 2 is a bottom view of magnet module 100 attached to epicyclic gearing system 200. In the depicted embodiment, epicyclic gearing system 200 includes three peripheral gears 204. In some embodiments, epicyclic gearing system 200 includes a single peripheral gear 204. In some embodiments, epicyclic gearing system 200 includes a plurality of peripheral gears 204. In the depicted embodiment, peripheral gears 204 are evenly spaced around central gear 202. In some embodiments, peripheral gears 204 are not evenly spaced around central gear 202.

A diameter of magnet module 100 ranges from about 60% to about 80% of a diameter of a sputtering chamber in which the magnet module is used. To maximize the use of a target material, magnet module 100 is sufficiently large to extend from beyond the axis of rotation of central gear 202 to an opposite outer edge of the target material. However, if magnet module 100 is too large, rotation and translation of the magnet module are ineffective in changing a location of a higher density plasma in the sputtering chamber.

The axis of rotation for central gear 202 is spaced from the axis of rotation for magnet module 100 and peripheral gear 204 by an offset distance OD. In some embodiments, the offset distance OD ranges from about 20 mm to about 40 mm. The offset distance OD is sufficiently sized so that magnet module 100 extends to an edge of the target in the sputtering chamber to maximize an amount of the target used during a sputtering process. The offset distance OD is sufficiently short that magnet module 100 extends beyond a center of the target, which would create a "blind spot" where the magnet module cannot focus the higher density plasma.

In some embodiments, central gear 202 has a diameter D1 ranging from about 66 mm to about 90 mm. In some embodiments, diameter D1 is 78 mm. The diameter D1 of central gear 202 is selected to provide a desired number and size of teeth in the central gear. As the diameter D1 of central gear 202 decreases, either the number or size of teeth in the central gear must also decrease. As discussed above, the number of teeth of central gear 202 is a factor in determining the relative rate of rotation for peripheral gear 204 and therefore magnet module 100. The size of the teeth of central gear 202 is a consideration for durability and precision of epicyclic gearing system. As the size of teeth decreases, interlocking the teeth of central gear 202 and peripheral gear 204 becomes more difficult. However, as the diameter of central gear 202 increases, the overall size of epicyclic gearing system increases or the size of peripheral gears 204 decreases.

In some embodiments, peripheral gears 204 have a diameter D2 ranging from about 34 mm to about 46 mm. In some embodiments, diameter D2 is 40.5 mm. The diameter D2 of peripheral gears 204 is selected based on similar criteria as discussed above with respect to central gear 202.

In some embodiments, annulus 206 has an inner diameter D3 ranging from about 134 mm to about 182 mm. In some embodiments, diameter D3 is 147 mm. The inner diameter D3 of annulus 206 is selected based on similar criteria as discussed above with respect to central gear 202.

In some embodiments, annulus 206 has an outer diameter D4 ranging from about 169 mm to about 219 mm. In some embodiments, diameter D4 is 190 mm. The outer diameter D4 of annulus 206 is selected relative to the inner diameter D3 to provide sufficient mechanical strength to resist damage from forces exerted on the annulus by the movement of peripheral gear 204.

In some embodiments, the dimensions OD and D1-D4 are adjusted based on dimensions of a sputtering module. The dimensions of epicyclic gearing system 202 and magnet module 100 are directly proportional to the dimensions of the sputtering module. For example, as the dimensions of the sputtering module increase, the dimensions of epicyclic gearing system and magnet module 100 increase in order to provide sufficient magnetic fields to all portions of the target.

Figure 3:
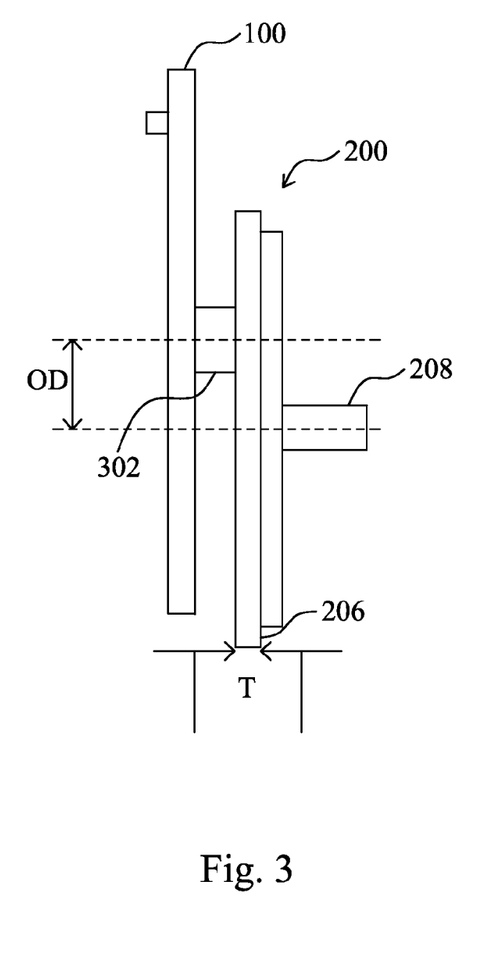
FIG. 3 is a side view of a magnet module attached to an epicyclic gearing system in accordance with one or more embodiments.

FIG. 3 is a side view of magnet module 100 attached to epicyclic gearing system 200. Magnet module 100 is connected to epicyclic gearing system 200 by a connection element 302. In some embodiments, connection element 302 is the same as peripheral shaft 701. In some embodiments, magnet module 100 has an axis of rotation parallel to the axis of rotation of peripheral gear 204. In some embodiments, the axis of rotation of magnet module 100 is different than the axis of rotation of peripheral gear 204. In some embodiments, connection element 302 is a screw or other means of connecting magnet module 100 to peripheral gear 204. In some embodiments, connection element 302 houses additional gears used to move the magnets attached to magnet module 100.

In some embodiments, annulus 206 has a thickness T ranging from about 8 mm to about 12 mm. In some embodiments, thickness T is 10 mm. The thickness T of annulus 206 is selected to provide sufficient mechanical strength to resist damage from forces exerted on the annulus by movement of peripheral gear 204.

Figure 4:
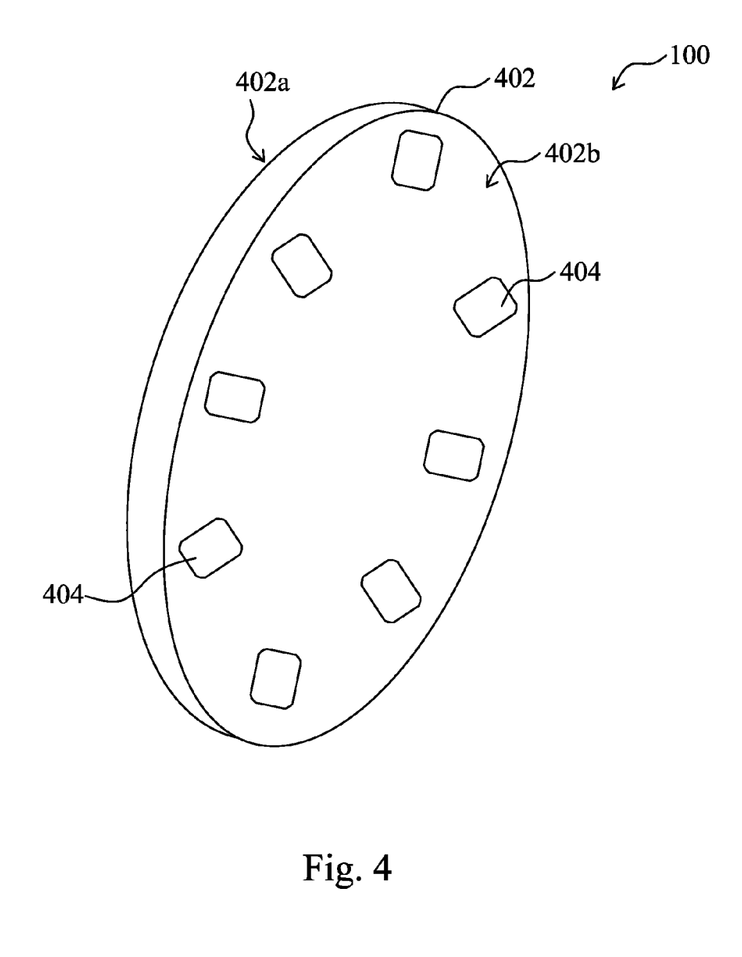
FIG. 4 is a perspective view of a magnet module in accordance with one or more embodiments.

FIG. 4 is a perspective view of magnet module 100. Magnet module 100 includes a backing plate 402 configured to connect to peripheral gear 204 on first surface 402a and magnets 404 are attached on a second opposite surface 402b. In some embodiments, magnet module 100 includes a counterweight.

In some embodiments, backing plate 402 is circular. In some embodiments, backing plate 402 is oval. In some embodiments, backing plate 402 is a freeform curvilinear shape. In some embodiments, backing plate 402 is rectangular, triangular or another suitable shape. In some embodiments, backing plate 402 houses gears or other actuators to actuate motion of magnets 404 relative to the backing plate.

In some embodiments, magnets 404 are permanent magnets to avoid interference with direct current biasing of the target or a wafer during a sputtering process. Magnets 404 are cylindrical, rectangular, or any other suitable shape. In the depicted embodiment, magnets 404 are symmetrically arranged on backing plate 402. In some embodiments, magnets 404 are asymmetrically arranged on backing plate 402.

In some embodiments, an end of magnets 404 farthest from backing plate 402 has either the first or second polarity. In some embodiments, magnets 404 are arranged such that the end farthest from backing plate 402 of some of the magnets are the first polarity and the end farthest from backing plate 402 of others of the magnets are the second polarity. In some embodiments, magnets 404 having the first polarity farthest from backing plate 402 and the magnets having the second polarity farthest from the backing plate are arranged in a pattern across the backing plate. In some embodiments, magnets 404 having the first polarity farthest from backing plate 402 and the magnets having the second polarity farthest from the backing plate are randomly arranged across the backing plate.

In some embodiments, magnets 404 are movable relative to backing plate 402. In some embodiments, magnets 404 are attached to backing plate 402 using ball in socket joints, intermediate actuators, a movable base or other suitable arrangements. In some embodiments, magnets 404 are connected to gear systems within backing plate 402 which are configured to rotate, pivot or translate the magnets relative to the backing plate.

In some embodiments, the counter-weight is used to balance magnet module 100 during rotation. If the arrangement of magnets 404 is such that a center of gravity of magnet module 100 is shifted away from the axis of rotation, the magnet module will be unbalanced and vibrate during rotation. Vibration by magnet module 100 increases the risk of damage to epicyclic gearing system 200 and other components around the magnet module. Vibration will also alter a magnetic field generated by magnet module 100. To reduce vibration, the counter-weight is sized and positioned to maintain the center of gravity of magnet module at the axis of rotation.

Figure 5:
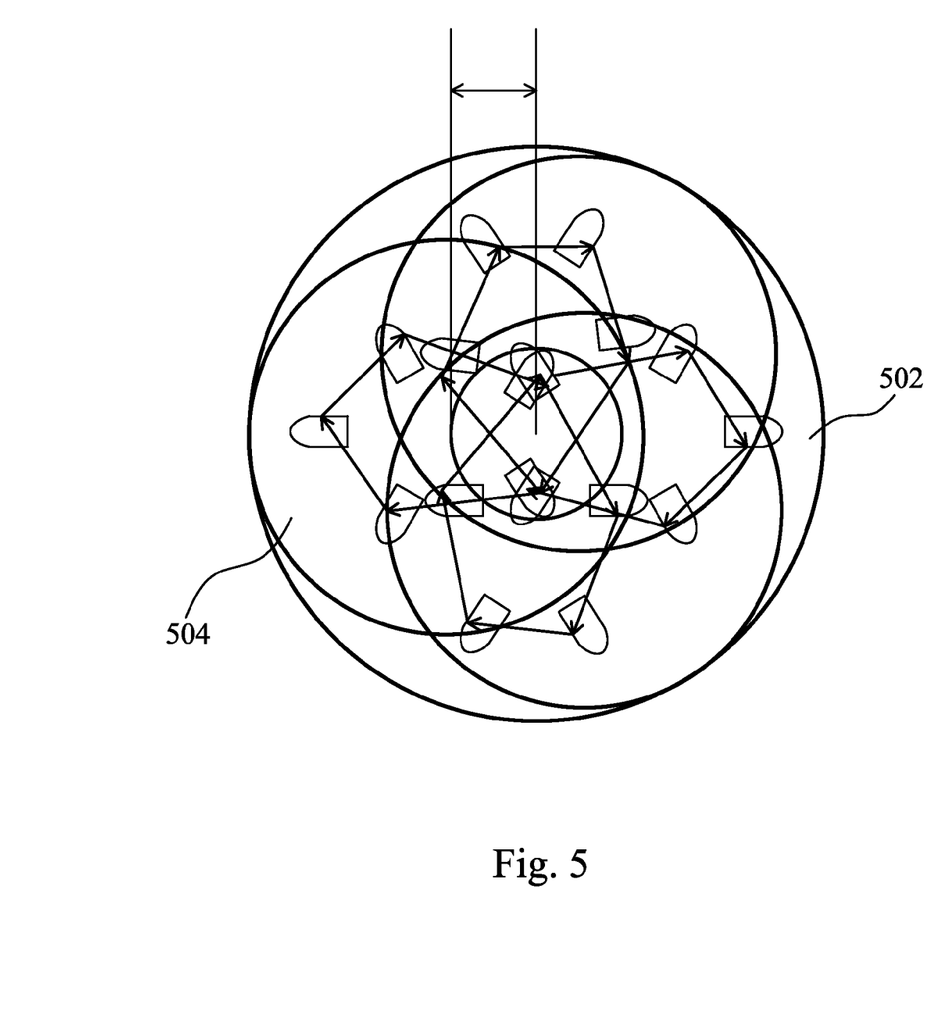
FIG. 5 is a path trace of magnets on a magnetic module during operation in accordance with one or more embodiments.

FIG. 5 is a path trace of magnets of magnet module 100 during operation. A track 502 depicts a path of a first magnet arranged adjacent an edge of magnet module 100. A track 504 depicts a path of a second magnet arranged adjacent a center of magnet module 100. Track 502 illustrates the concurrent rotation and translation of magnet module 100 during operation of epicyclic gearing system 200. The first magnet travels from a position close to annulus 206 to a position on an opposite side of a center point of the annulus in an arc path. The first magnet also travels around the inner diameter of the annulus. Track 504 illustrates the translation of magnet module 100 during operation. As depicted by tracks 502 and 504, the path of the magnets of magnet module 100 are configured to effectively shift the location of the higher density plasma across an entire surface of the target during a sputtering operation. The path for only two magnets is shown for simplicity, however, in some embodiments; magnet module 100 includes more than two magnets.

Figure 6:
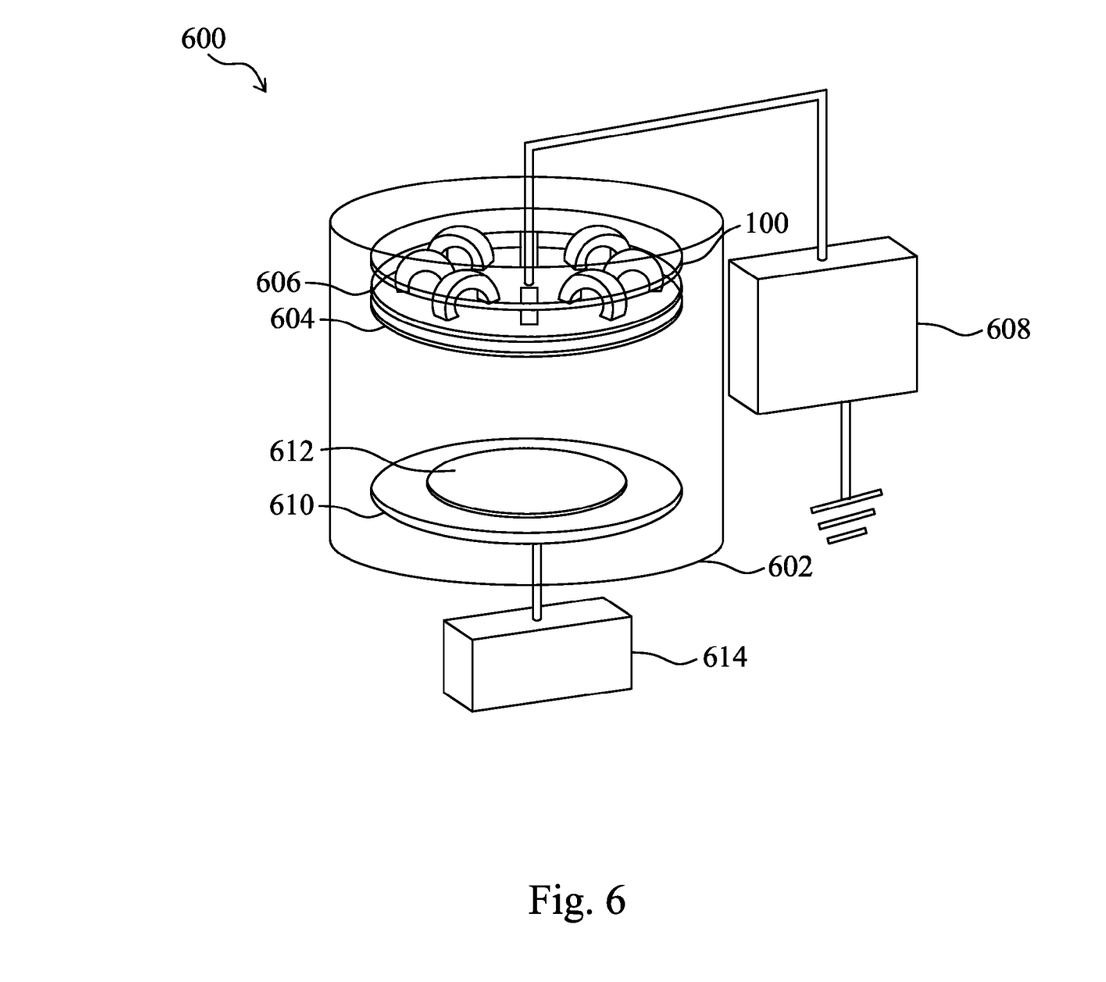
FIG. 6 is a schematic diagram of a sputtering module in accordance with one or more embodiments.

FIG. 6 is a schematic diagram of a sputtering module 600. Sputtering module 600 includes a sputtering chamber 602 which houses magnet module 100. Sputtering chamber 602 also houses a target 604 disposed near magnet module 100 and a top electrode 606 between target 604 and magnet module 100. Top electrode 606 is configured to receive a direct current voltage from a power source 608. Sputtering chamber 602 also houses a bottom electrode 610 which supports a wafer 612. Bottom electrode 610 is configured to receive a bias voltage from a bias source 614. Target 604 is spaced from wafer 612 so that a gas introduced into sputtering chamber 602 fills at least a portion of the space between target 604 and wafer 612.

The gas is introduced into sputtering chamber 602 and ignited to form a plasma. In some embodiments, the gas is argon. In some embodiments, the gas is oxygen, nitrogen or another suitable gas. If the gas is oxygen, the atoms sputtered from the target are deposited as oxides. If the gas is nitrogen, the atoms sputtered from the target 604 are deposited as nitrides. In some embodiments, the gas in sputtering chamber 602 is maintained at a pressure ranging from about 1 mTorr to about 1000 mTorr. In some embodiments, the gas in sputtering chamber 602 is maintained at a pressure below 1 mTorr.

In some embodiments, target 604 comprises a metal such as copper, aluminum, titanium, tantalum, alloys or another suitable metal. For an interconnect structure in which aluminum is used to form metal lines and vias, aluminum is sputtered from target 604 to fill openings in the interconnect structure to form the metal lines and via. For an interconnect structure in which copper is used to form the metal lines and vias, copper is sputtered from target 604. In some embodiments, the copper fills openings in the interconnect structure to form the metal lines and vias. In some embodiments, the copper fills only a portion of the openings to form a seed layer to facilitate electroplating of copper to form the metal lines and vias.

In operation, top electrode 606 ignites the gas to form the plasma. Magnet module 100 attracts ions from the plasma to target 604. The ions sputter atoms from target 604 into sputtering chamber 602. Bottom electrode 610 attracts the sputtered atoms toward wafer 612. The sputtered atoms adhere to the exposed surfaces of wafer 612 including openings for lines and vias. Excess material from target 602 deposited on wafer 612 is removed using a chemical mechanical polishing (CMP) process after deposition is complete. In some embodiments, the process of depositing material from target 602 onto wafer 612 is repeated to form multiple interconnect layers.

FIG. 7 is a cross-sectional view of a sputtering module 700. For simplicity, only a top portion of sputtering chamber 602 is depicted in FIG. 7. Sputtering module 700 includes magnet module 100. Magnet module 100 is attached to one of peripheral gears 204. Peripheral gear 204 is situated between central gear 202 and annulus 206. At least one of peripheral gear 204 and central gear 202 are rotatably attached to support structure 201. A motor 702 is connected to shaft 208 to rotate central gear 202. A plasma 704 is formed and contained within sputtering chamber 602 and target 604 is positioned between plasma 704 and magnet module 100. Cooling water 706 is circulated around central gear 202, peripheral gear 204 and annulus 206 to maintain a constant temperature and minimize wear on the gears of sputtering module 700.

As depicted in FIG. 7, magnet module 100 extends across the axis of rotation of central gear 202 to prevent a "blind spot" in the magnetic field generated adjacent target 604. In operation, as magnet module 100 rotates and translates above target 604, a density of plasma 704 changes based on a location of the magnet field generated by the magnet module. The density of the plasma at any location across target 604 is directly related to the magnetic field. The rate of sputtering atoms from target 604 is directly related to the density of the plasma. By moving magnet module 100, effects of the magnet field are distributed across target 604 resulting in more uniform sputtering of the target material. The result is an increased utilization of the material of target 604 in comparison with conventional techniques.

The rate of movement of magnet module 100 impacts the distribution of the magnetic field. As the rate of movement increases, the uniformity of the magnetic field increases; however, as the rate of movement increases a rate of wearing on central gear 202, peripheral gear 204 and annulus 206 increases thereby shortening the lifespan of the epicyclic gearing system 200. In some embodiments, motor 702 is configured to rotate central gear 202 at a rate ranging from about 80 revolutions per minute (rpms) to about 110 rpms. A rate of movement of peripheral gear 204 is determined based on the number of teeth in the peripheral gear and central gear 202, as discussed above.

Circulation of cooling water 706 is configured to absorb and remove heat generated by motor 702 and epicyclic gearing system 200. By absorbing the heat, cooling water 706 helps to prevent warping or damage to components of epicyclic gearing system 200.

Figure 8:
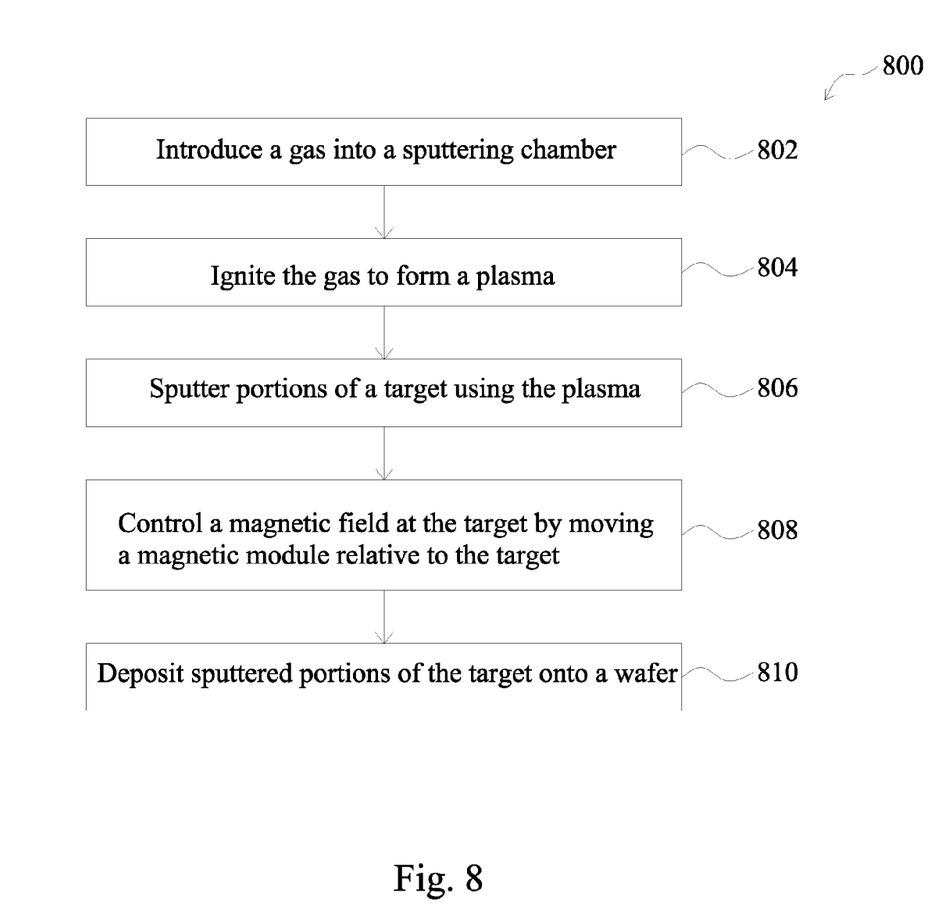
FIG. 8 is a flowchart of a method of using a sputtering module in accordance with one or more embodiments.

FIG. 8 is a flowchart of a method 800 of using a sputtering module. Method 800 begins with operation 802, in which a gas is introduced into a sputtering chamber. In some embodiments, the gas comprises argon, oxygen, nitrogen or other suitable gases. In some embodiments, the gas is introduced through a controllable valve, configured to control a flow rate of the gas. In some embodiments, the flow rate of the gas is controlled to maintain a pressure within the sputtering chamber ranging from about 1 mTorr to about 1000 mTorr.

In operation 804, the gas is ignited to form a plasma in the sputtering chamber. In some embodiments, the gas is ignited using a top electrode disposed in the sputtering chamber. The top electrode is configured to receive a direct current voltage which is used to ionize the gas. The ions are attracted to a target.

In operation 806, the plasma sputters a portion of the target. The ions of the plasma move toward the target with sufficient energy to physically remove portions of the target. In some embodiments, the removed portions include atoms or atomic groups. The rate of sputtering of the target is determined based on a density of the plasma and an energy with which the ions contact the target. In some embodiments, the target includes aluminum, copper, titanium, tantalum, alloys or other suitable materials.

In operation 808, a magnetic field at the target is controlled by moving a magnet module relative to the target. By moving the magnet module, a location of the magnetic field is altered. The ions of the plasma are attracted to by the magnetic field, thereby increasing the density of the plasma at the location of the magnetic field, i.e., forming a higher density of the plasma. The increased density of the plasma increases the rate of sputtering of the target. By controlling the location of the higher density of the plasma, the rate of sputtering of the plasma is evenly distributed over the target, thereby increasing a yield of the target. In some embodiments, the magnet module is moved using a motor attached to an epicyclic gearing system. In some embodiments, the motor rotates a central gear of the epicyclic gearing system at a rate ranging from about 80 rpms to about 110 rpms.

In operation 810, the sputtered portions of the target are deposited on a wafer. After the plasma sputters portions of the target, the portions of the target are dispersed into the sputtering chamber. A biased pedestal supporting the wafer attracts the sputtered portions toward the wafer. The sputtered portions which contact the wafer are deposited thereon and form layers comprising the material of the target. In some embodiments, if the gas includes oxygen the deposited material is an oxidized version of the target, for example, aluminum oxide is deposited on the wafer if the target is aluminum. In some embodiments, if the gas includes nitrogen the deposited material is a nitride version of the target, for example, aluminum nitride is deposited on the wafer if the target is aluminum.

One aspect of this disclosure relates to a magnet assembly including an epicyclic gearing system. The epicyclic gearing system including a central gear configured to be rotated, at least one peripheral gear connected to the central gear and configured to rotate and translate relative to the central gear, and an annulus surrounding the at least one peripheral gear and connected with the at least one peripheral gear. The magnet assembly further includes a magnet module connected with the epicyclic gearing system, the magnet module including a support connected with the at least one peripheral gear, the axis of rotation of the support being coaxial with the axis of rotation of the at least one peripheral gear connected with the support. The magnet module further including the plurality of magnets including at least one first magnet having a first polarity positioned farthest from the support and at least a second magnet having a second polarity positioned farthest from the support.

Another aspect of this disclosure relates to a sputtering module including sputtering chamber configured to receive a gas. The sputtering module further includes a magnet assembly positioned at one end of the sputtering chamber. The magnet assembly including an epicyclic gearing system. The epicyclic gearing system including a central gear configured to be rotated, at least one peripheral gear connected to the central gear and configured to rotate and translate relative to the central gear, and an annulus surrounding the at least one peripheral gear and connected with the at least one peripheral gear. The magnet assembly further includes a magnet module connected with the epicyclic gearing system, the magnet module including a support connected with the at least one peripheral gear, the axis of rotation of the support being coaxial with the axis of rotation of the at least one peripheral gear connected with the support. The magnet module further including the plurality of magnets including at least one first magnet having a first polarity positioned farthest from the support and at least a second magnet having a second polarity positioned farthest from the support. The sputtering module further includes a wafer support positioned at an end of the sputtering chamber distal from the magnet assembly. The sputtering module further includes a target disposed in the sputtering chamber between the wafer support and the magnet assembly.

Another aspect of this disclosure relates to a method of using a sputtering module. The method includes introducing a gas into the sputtering module. The method further includes igniting the gas to form a plasma. The method further includes sputtering a portion of a target using the plasma. The method further includes controlling a magnetic field at the target using a magnet assembly. The method further includes depositing the sputtered portions of the target onto a wafer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A magnet assembly comprising:
an epicyclic gearing system, the epicyclic gearing system comprising:
a central gear configured to rotate;
at least one peripheral gear connected to the central gear and configured to rotate and translate relative to the central gear; and
an annulus surrounding the at least one peripheral gear and connected with the at least one peripheral gear; and
a magnet module connected with the epicyclic gearing system, the magnet module comprising:
a circular support connected with the at least one peripheral gear, the circular support being coaxial with an axis of rotation of the at least one peripheral gear connected with the circular support; and
a plurality of magnets on a surface of the circular support opposite to the peripheral gear, the plurality of magnets including at least one first magnet having a first polarity positioned farthest from the circular support and at least a second magnet having a second polarity positioned farthest from the circular support,
wherein the circular support has a radius greater than a distance between the axis of rotation of the central gear and the axis of rotation of the at least one peripheral gear, and the magnets of the plurality of magnets are each positioned on the surface of the circular support to facilitate dispersion of a plasma across an entire surface of a target material in a sputtering chamber.

2. The magnet assembly of claim 1, wherein the axis of rotation of the central gear is spaced from the axis of rotation of the circular support by a distance ranging from about 20 mm to about 40 mm.

3. The magnet assembly of claim 1, wherein the plurality of magnets are permanent magnets.

4. The magnet assembly of claim 1, wherein at least one of the plurality of magnets are movable relative to the circular support.

5. The magnet assembly of claim 1, wherein the magnet module further comprises a counter-weight.

6. The magnet assembly of claim 1, wherein the plurality of magnets are distributed in an asymmetrical arrangement across the circular support.

7. The magnet assembly of claim 1, wherein the dispersion of the plasma is uniform across the entire surface of the target material in the sputtering chamber.

8. A sputtering module comprising:
a sputtering chamber configured to receive a gas;
a magnet assembly positioned at one end of the sputtering chamber, the magnet assembly comprising:
an epicyclic gearing system, the epicyclic gearing system comprising:
a central gear configured to rotate;
at least one peripheral gear connected to the central gear and configured to rotate and translate relative to the central gear; and
an annulus surrounding the at least one peripheral gear and connected with the at least one peripheral gear; and
a magnet module connected with the epicyclic gearing system, the magnet module comprising:
a circular support connected with the at least one peripheral gear, the circular support being coaxial with an axis of rotation of the at least one peripheral gear connected with the circular support; and
a plurality of magnets on a surface of the circular support opposite to the peripheral gear, the plurality of magnets including at least one first magnet having a first polarity positioned farthest from the circular support and at least a second magnet having a second polarity positioned farthest from the circular support;
a wafer support positioned at an end of the sputtering chamber distal from the magnet assembly; and
a target disposed in the sputtering chamber positioned between the wafer support and the magnet assembly,
wherein the circular support has a radius greater than a distance between the axis of rotation of the central gear and the axis of rotation of the at least one peripheral gear, and the magnets of the plurality of magnets are each positioned on the surface of the circular support to facilitate dispersion of a plasma across an entire surface of the target.

9. The sputtering module of claim 8, wherein an axis of rotation of the central gear is spaced from the axis of rotation of the circular support by a distance ranging from about 20 mm to about 40 mm.

10. The sputtering module of claim 8, wherein the gas comprises argon, oxygen or nitrogen.

11. The sputtering module of claim 8, wherein the target comprises aluminum, copper, titanium, tantalum or alloys thereof.

12. The sputtering module of claim 8, wherein the magnet module further comprises a counter-weight.

13. The sputtering module of claim 8, wherein at least one of the plurality of magnets are moveable relative to the circular support.

14. The sputtering module of claim 8, further comprising a top electrode positioned between the target and the magnet assembly, the top electrode configured to ignite the gas to form a plasma.

15. The sputtering module of claim 8, wherein the magnet module has a diameter in a range of about 60% to about 80% a diameter of the sputtering chamber.

16. A magnet assembly comprising:
an epicyclic gearing system, the epicyclic gearing system comprising:
a central gear configured to rotate;
a plurality of sets of concentric peripheral gears connected to the central gear and configured to rotate and translate relative to the central gear; and
an annulus surrounding the peripheral gears of the plurality of sets of concentric peripheral gears and connected with the peripheral gears of the plurality of sets of concentric peripheral gears; and
a magnet module connected with the epicyclic gearing system, the magnet module comprising:
a circular support connected with at least one peripheral gear of the plurality of sets of concentric peripheral gears, the circular support being coaxial with an axis of rotation of the at least one peripheral gear connected with the circular support; and
a plurality of magnets on a surface of the circular support opposite to the at least one peripheral gear, the plurality of magnets including at least one first magnet having a first polarity positioned farthest from the circular support and at least a second magnet having a second polarity positioned farthest from the circular support,
wherein the circular support has a radius greater than a distance between the axis of rotation of the central gear and the axis of rotation of the at least one peripheral gear, and the magnets of the plurality of magnets are each positioned on the surface of the circular support to facilitate dispersion of a plasma across an entire surface of a target material in a plasma chamber.

17. The magnet assembly of claim 16, wherein the plurality of sets of concentric peripheral gears are evenly spaced around the central gear.

18. The magnet assembly of claim 16, wherein an edge of the magnet module extends across the axis of rotation of the central gear.

19. The magnet assembly of claim 16, wherein the plurality of magnets are distributed in an asymmetrical arrangement across the circular support.

20. The magnet assembly of claim 16, wherein at least one of the plurality of magnets are movable relative to the circular support.

* * * * *